US009581889B2

(12) United States Patent
Hassan et al.

(10) Patent No.: US 9,581,889 B2
(45) Date of Patent: Feb. 28, 2017

(54) PLANARIZED EXTREME ULTRAVIOLET LITHOGRAPHY BLANK WITH ABSORBER AND MANUFACTURING SYSTEM THEREFOR

(71) Applicant: Applied Materials, Inc., Santa Clara, CA (US)

(72) Inventors: Vinayak Vishwanath Hassan, Santa Clara, CA (US); Majeed A. Foad, Sunnyvale, CA (US); Cara Beasley, Scotts Valley, CA (US); Ralf Hofmann, Soquel, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/620,123

(22) Filed: Feb. 11, 2015

(65) Prior Publication Data

US 2016/0011500 A1 Jan. 14, 2016

Related U.S. Application Data

(60) Provisional application No. 62/023,507, filed on Jul. 11, 2014.

(51) Int. Cl.

| | |
|---|---|
| ***G03F 1/22*** | (2012.01) |
| ***G03F 1/38*** | (2012.01) |
| ***C23C 16/06*** | (2006.01) |
| ***G03F 1/24*** | (2012.01) |

(52) U.S. Cl.

CPC ................ *G03F 1/22* (2013.01); *C23C 16/06* (2013.01); *G03F 1/24* (2013.01); *G03F 1/38* (2013.01)

(58) Field of Classification Search

CPC .................................... G03F 1/22; G03F 1/38

USPC ............................................................ 430/5

See application file for complete search history.

(56) References Cited

U.S. PATENT DOCUMENTS

| | | | |
|---|---|---|---|
| 8,691,476 | B2 | 4/2014 | Yu et al. |
| 8,802,335 | B2 | 8/2014 | Oh et al. |
| 8,932,785 | B2 | 1/2015 | Utzny |
| 2004/0151988 | A1 | 8/2004 | Silverman |

(Continued)

FOREIGN PATENT DOCUMENTS

| | | |
|---|---|---|
| JP | 2013120868 A | 6/2013 |

OTHER PUBLICATIONS

International Search Report and Written Opinion for PCT App No. PCT/US2015/039525 dated Sep. 18, 2015.

(Continued)

*Primary Examiner* — Stephen Rosasco

(74) *Attorney, Agent, or Firm* — Servilla Whitney LLC

(57) ABSTRACT

An extreme ultraviolet (EUV) mask blank production system includes: a substrate handling vacuum chamber for creating a vacuum; a substrate handling platform, in the vacuum, for transporting an ultra-low expansion substrate loaded in the substrate handling vacuum chamber; and multiple sub-chambers, accessed by the substrate handling platform, for forming an EUV mask blank includes: a first sub-chamber for forming a multi-layer stack, above the ultra-low expansion substrate, for reflecting an extreme ultraviolet (EUV) light; and a second sub-chamber for forming a bi-layer absorber, formed above the multi-layer stack, for absorbing the EUV light at a wavelength of 13.5 nm provides a reflectivity of less than 1.9%.

10 Claims, 6 Drawing Sheets

(56) References Cited

U.S. PATENT DOCUMENTS

| | | | |
|---|---|---|---|
| 2005/0084773 A1 | 4/2005 | Krauth | |
| 2007/0020903 A1 | 1/2007 | Takehara et al. | |
| 2011/0104595 A1 | 5/2011 | Hayashi et al. | |
| 2012/0129083 A1 | 5/2012 | Yoshimori et al. | |
| 2014/0192335 A1 | 7/2014 | Hagio et al. | |
| 2014/0212794 A1 | 7/2014 | Maeshige et al. | |
| 2014/0268080 A1* | 9/2014 | Beasley .............. | G03F 7/70958 355/67 |

OTHER PUBLICATIONS

U.S. Appl. No. 14/620,114, filed Feb. 11, 2015, Hassan et al.
PCT International Search Report in PCT/US2015/039533 dated Sep. 21, 2015, 3 pages.
Non-Final Office Action in U.S. Appl. No. 14/620,114 dated Jul. 22, 2016, 15 pages.

* cited by examiner

PLANARIZED EXTREME ULTRAVIOLET LITHOGRAPHY BLANK WITH ABSORBER AND MANUFACTURING SYSTEM THEREFOR

CROSS-REFERENCE TO RELATED APPLICATION(S)

This application claims the benefit of U.S. Provisional Patent Application Ser. No. 62/023,507 filed Jul. 11, 2014, and the subject matter thereof is incorporated herein by reference thereto.

The present application contains subject matter related to a concurrently filed U.S. patent application Ser. No. 14/620,114 filed Feb. 11, 2015. The related application is assigned to Applied Materials, Inc. The subject matter thereof is incorporated herein by reference thereto.

TECHNICAL FIELD

The present invention relates generally to extreme ultraviolet lithography blanks, and manufacturing and lithography systems for such extreme ultraviolet lithography blanks.

BACKGROUND

Extreme ultraviolet lithography (EUV, also known as soft x-ray projection lithography) is a contender to replace deep ultraviolet lithography for the manufacture of 0.0135 micron, and smaller, minimum feature size semiconductor devices.

However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass; e.g., 12.5 to 14.5 nanometer bandpass for 13.5 nanometer extreme ultraviolet (EUV) light.

There are various classes of defects in semiconductor processing technology which cause problems. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. And phase defects are typically caused by scratches and surface variations beneath the multilayer coatings which cause transitions in the phase of the reflected light. These phase transitions result in light wave interference effects which distort or alter the pattern that is to be exposed in the resist on the surface of the semiconductor substrate. Because of the shorter wavelengths of radiation which must be used for sub-0.0135 micron minimum feature size, scratches and surface variations which were insignificant before now become intolerable.

The problem that the thin absorber addresses is the shadowing issues seen with thicker absorbers as the pattern gets smaller, which ends up limiting the size features that can be printed on a substrate. Achieving a thinner absorber requires using new materials that absorb 13.5 nm light better than the current absorbers in use.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention is an extreme ultraviolet (EUV) mask blank production system including: a substrate handling vacuum chamber for creating a vacuum; a substrate handling platform, in the vacuum, for transporting an ultra-low expansion substrate loaded in the substrate handling vacuum chamber; and multiple sub-chambers, accessed by the substrate handling platform, for forming an EUV mask blank including: a first sub-chamber for forming a multi-layer stack, above the ultra-low expansion substrate, for reflecting an extreme ultraviolet (EUV) light; and a second sub-chamber for forming a bi-layer absorber, formed above the multi-layer stack, for absorbing the EUV light at a wavelength of 13.5 nm provides a reflectivity of less than 1.9%.

An embodiment of the present invention is an extreme ultraviolet (EUV) mask blank system including: an ultra-low expansion substrate includes surface imperfections; a planarization layer on the ultra-low expansion substrate for encapsulating the surface imperfections; a multi-layer stack over the planarization layer; and a bi-layer absorber over the multi-layer stack includes determining a percent of reflectivity by controlling a thickness of a primary absorber layer and a secondary absorber layer of the bi-layer absorber deposited to a combined thickness of 30 nm provides a reflectivity of less than 1.9%.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
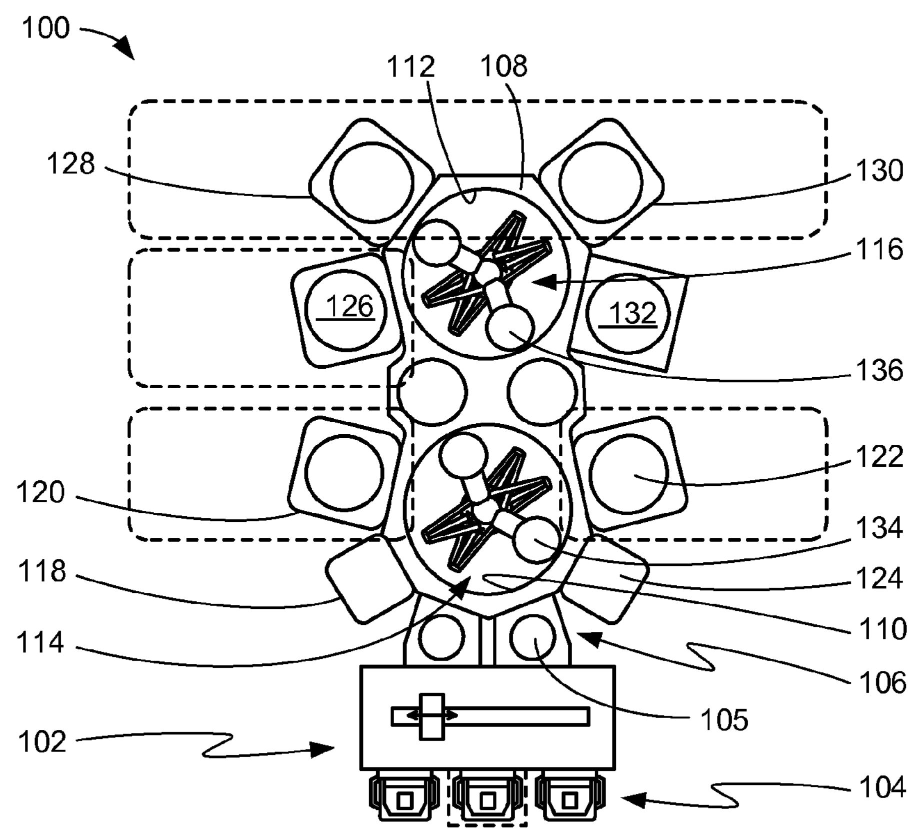
FIG. 1 is an extreme ultraviolet (EUV) mask blank production system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown an extreme ultraviolet (EUV) mask blank production system 100. The integrated EUV mask blank production system 100 includes a mask blank loading and carrier handling system 102 having load ports 104 into which transport boxes containing substrates 105, such as substrates of glass, silicon, or other ultra-low thermal expansion material, are loaded. An airlock 106 provides access to a substrate handling vacuum chamber 108. In an embodiment, the substrate handling vacuum chamber 108 can contain two vacuum chambers, a first vacuum chamber 110 and a second vacuum chamber 112. The first vacuum chamber 110 can contain an initial substrate handling platform 114 and the second vacuum chamber 112 can contain a second substrate handling platform 116.

The substrate handling vacuum chamber 108 can have a plurality of ports around its periphery for attachment of various subsystems. The first vacuum chamber 110 can, for example, have a degas subsystem 118, a first physical vapor deposition sub-chamber 120 such as a bi-layer absorber deposition chamber, a second physical vapor deposition sub-chamber 122 such as a backside chucking layer deposition chamber, and a preclean subsystem 124.

The second vacuum chamber 112 can have a first multi-cathode sub-chamber 126 such as a multilayer deposition chamber, a flowable chemical vapor deposition (FCVD) sub-chamber 128 such as a planarization layer deposition chamber, a cure sub-chamber 130, and a second multi-cathode sub-chamber 132 connected to it.

The initial substrate handling platform 114 is capable of moving an ultra-low expansion substrate, such as a first in-process substrate 134, among the airlock 106 and the various subsystems around the periphery of the first vacuum chamber 110 and through slit valves, not shown, in a continuous vacuum. The second substrate handling platform 116 can move an ultra-low expansion substrate, such as a second in-process substrate 136, around the second vacuum chamber 112 while maintaining the second in-process substrate 136 in a continuous vacuum.

It has been discovered that the integrated EUV mask blank production system 100 can provide an environment for manufacturing EUV mask blanks, while minimizing the manual transport of the first in-process substrate 134 and the second in-process substrate 136.

Figure 2:
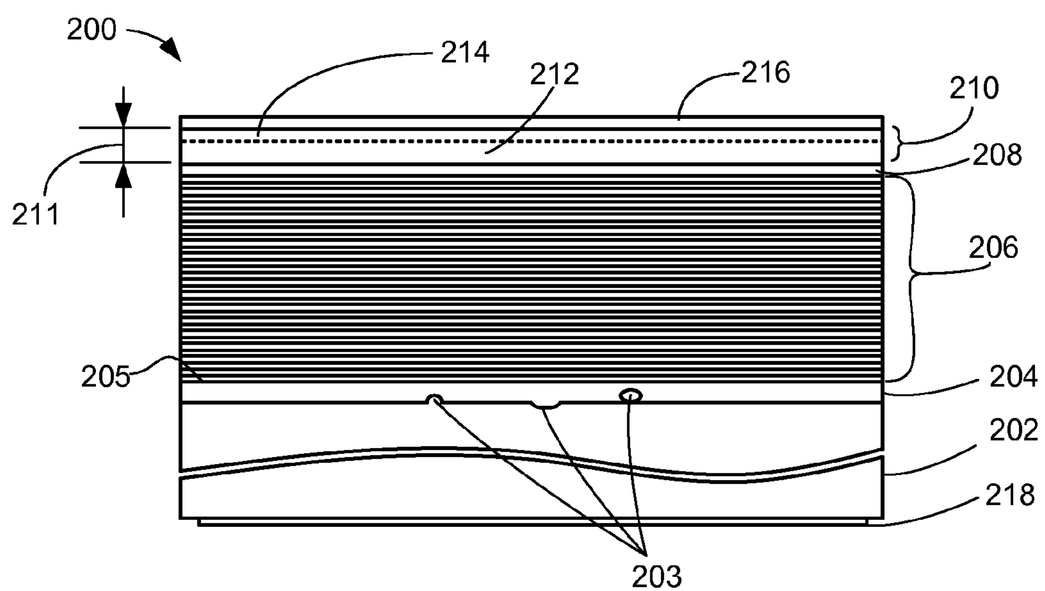
FIG. 2 is a cross-sectional view of an EUV mask blank in accordance with an embodiment.

Referring now to FIG. 2, therein is a cross-sectional view of an EUV mask blank 200 in accordance with an embodiment. The EUV mask blank 200 can have an ultra-low thermal expansion substrate 202 of glass, silicon, or other ultra-low thermal expansion material. The ultra-low thermal expansion materials include fused silica, fused quartz, calcium fluoride, silicon carbide, silicon oxide-titanium oxide, or other material having a thermal coefficient of expansion within the range of these materials.

It has been discovered that a planarization layer 204 can be used for filling surface imperfections 203, such as pits and/or defects in the ultra-low expansion substrate 202, covering particles on top of the ultra-low expansion substrate 202, or smoothing an already planarized surface of the ultra-low expansion substrate 202 to form a planar surface 205.

A multi-layer stack 206 can be formed on the planarization layer 204 to form a Bragg reflector. Due to the absorptive nature of the illuminating wavelengths used in EUV lithography, reflective optics are used. The multi-layer stack 206 may be made of alternating layers of high-Z and low-Z materials, such as molybdenum and silicon in order to form a reflector.

A capping layer 208 is formed on the multi-layer stack 206 opposite the ultra-low expansion substrate 202 for forming a capped Bragg reflector. The capping layer 208 can be a material such as Ruthenium (Ru) or a non-oxidized compound thereof to help protect the multi-layer stack 206 from oxidation and any chemical etchants to which the EUV mask blank 200 may be exposed during subsequent mask processing. Other material such as titanium nitride, boron carbide, silicon nitride, ruthenium oxide, and silicon carbide may also be used in the capping layer 208.

A bi-layer absorber 210 is placed on the capping layer 208. The bi-layer absorber 210 can include a primary absorber layer 212 and a secondary absorber layer 214. The bi-layer absorber 210 is of a material pair having a high absorption coefficient in combination for a particular frequency of EUV light (about 13.5 nm). In an embodiment, the primary absorber layer 212, such as silver (Ag), can be formed directly on the capping layer 208 and the secondary absorber layer 214, such as nickel (Ni), can be formed directly on the primary absorber layer 212.

The bi-layer absorber 210 must be kept as thin as possible in order to reduce the surface parallax that causes shadowing in a mask formed on the EUV mask blank 200. One of the limitation with the absorber layer, formed of chromium, tantalum or nitrides thereof having the thickness 211 greater than 80 nm, is that the angle of incidence of the EUV light can cause shadowing which limits that pattern size that can achieved in an integrated circuit produced by a mask using the EUV mask blank, which limits the size of integrated circuit devices that can be fabricated.

It has been discovered that the selection of the material of the primary absorber layer 212 and the secondary absorber layer 214 is very important for reflectivity loss due to path difference induced phase shift. By way of an example, the embodiment can have the bi-layer absorber 210 having a 30 nm thickness 211 made-up of the primary absorber layer 212 being a 27.7 nm layer of silver (Ag) and the secondary absorber layer 214 being a 2.3 nm layer of nickel (Ni). This embodiment can provide a reflectivity percentage of only 0.58%.

An anti-reflective coating (ARC) 216 is deposited on the bi-layer absorber 210. The ARC 216 can be of a material such as tantalum oxynitride or tantalum boron oxide.

A backside chucking layer 218 is formed on the back-side surface of the ultra-low expansion substrate 202, opposite the planarization layer 204, for mounting the substrate on or with an electrostatic chuck (not shown).

Figure 3:
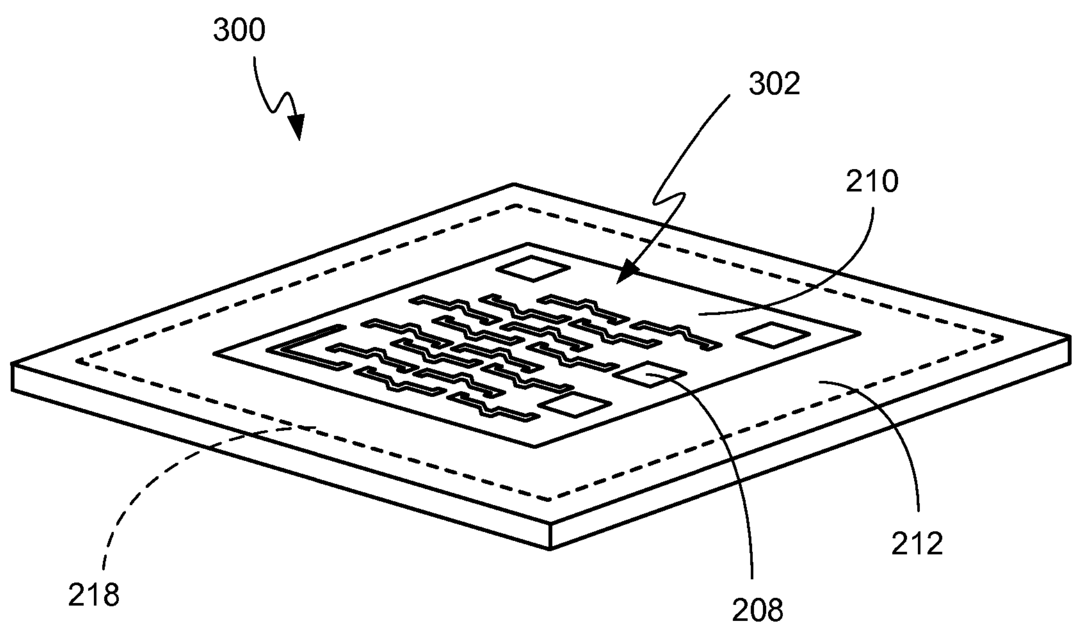
FIG. 3 is an orthogonal view of an EUV mask.

Referring now to FIG. 3, therein is shown an orthogonal view of an EUV mask 300. The EUV mask 300 can be a rectangular shape and can have a pattern 302 on the top surface thereof The pattern 302 can be etched into the ARC 216 and the bi-layer absorber 210 of FIG. 2 exposing the capping layer 208 for representing the geometry associated with a step in the manufacturing of an integrated circuit, not shown. The backside chucking layer 218 can be applied on the backside of the EUV mask 300 opposite the pattern 302.

Figure 4:
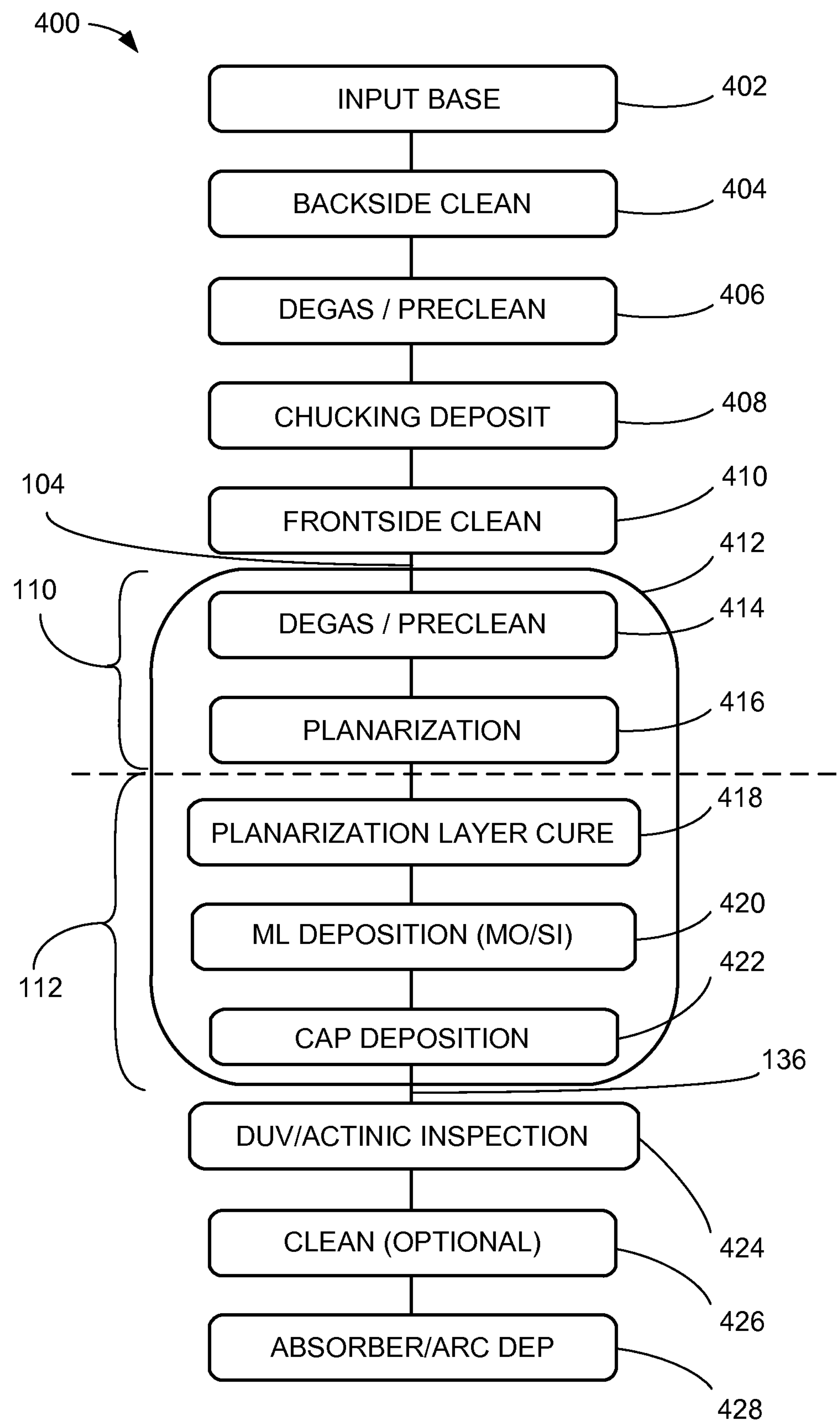
FIG. 4 is a flow chart of a method for making the EUV mask blank with ultra-low defects.

Referring now to FIG. 4, therein is shown a flow chart of a method 400 for making the EUV mask blank 200 with ultra-low defects. The ultra-low defects are substantially zero defects. The method 400 includes the ultra-low expansion substrate 202 of FIG. 2 being supplied at an input base step 402. The ultra-low expansion substrate 202 can be backside cleaned in a substrate cleaning step 404, degassed and pre-cleaned in a backside prep step 406.

The backside chucking layer 218 of FIG. 2 is applied in a back-side chucking step 408 and a front-side clean is performed in a front-side cleaning step 410. The mask blank 104, after the front-side cleaning step 410, can be input to the first vacuum chamber 110 for further processing. The steps of forming a capped Bragg reflector 412 are better performed in the EUV mask blank production system 100 of FIG. 1 while under continuous vacuum to avoid contamination from ambient conditions.

A degas and preclean step 414 and planarization step 416 is performed in the first vacuum chamber 110. The planarization layer 204 of FIG. 2 can be cured in a planarization layer cure step 418 and the deposition of the multi-layer stack 206 of FIG. 2 is performed in a depositing the multi-layer stack step 420 can be performed in the second vacuum chamber 112. The capping layer 208 of FIG. 2 can be deposited in a depositing a capping layer step 422 within the second vacuum chamber 112 for forming the second in-process substrate 136, such as the capped Bragg reflector.

After exiting the EUV mask blank production system 100, the second in-process substrate 136 is subjected to a deep ultraviolet (DUV)/Actinic inspection, which is performed in a close inspection step 424, the second in-process substrate 136 is optionally cleaned in a second front-side cleaning step 426, and the absorber layer 210 of FIG. 2 and anti-reflective coating 212 of FIG. 2 can be deposited in an EUV mask blank completion step 428 for forming the EUV mask blank 200 of FIG. 2.

It has been discovered that the EUV mask blank production system 100 can produce the EUV mask blank 200 consistently with substantially zero defects. The Application of the planarization layer 204 in the first vacuum chamber 110 and the curing of the planarization layer 204 in the second vacuum chamber 112 can improve the efficiency of the EUV mask blank production system 100 because the chambers do not require thermal ramp time between the deposition of the planarization layer 204 and its curing.

Figure 5:
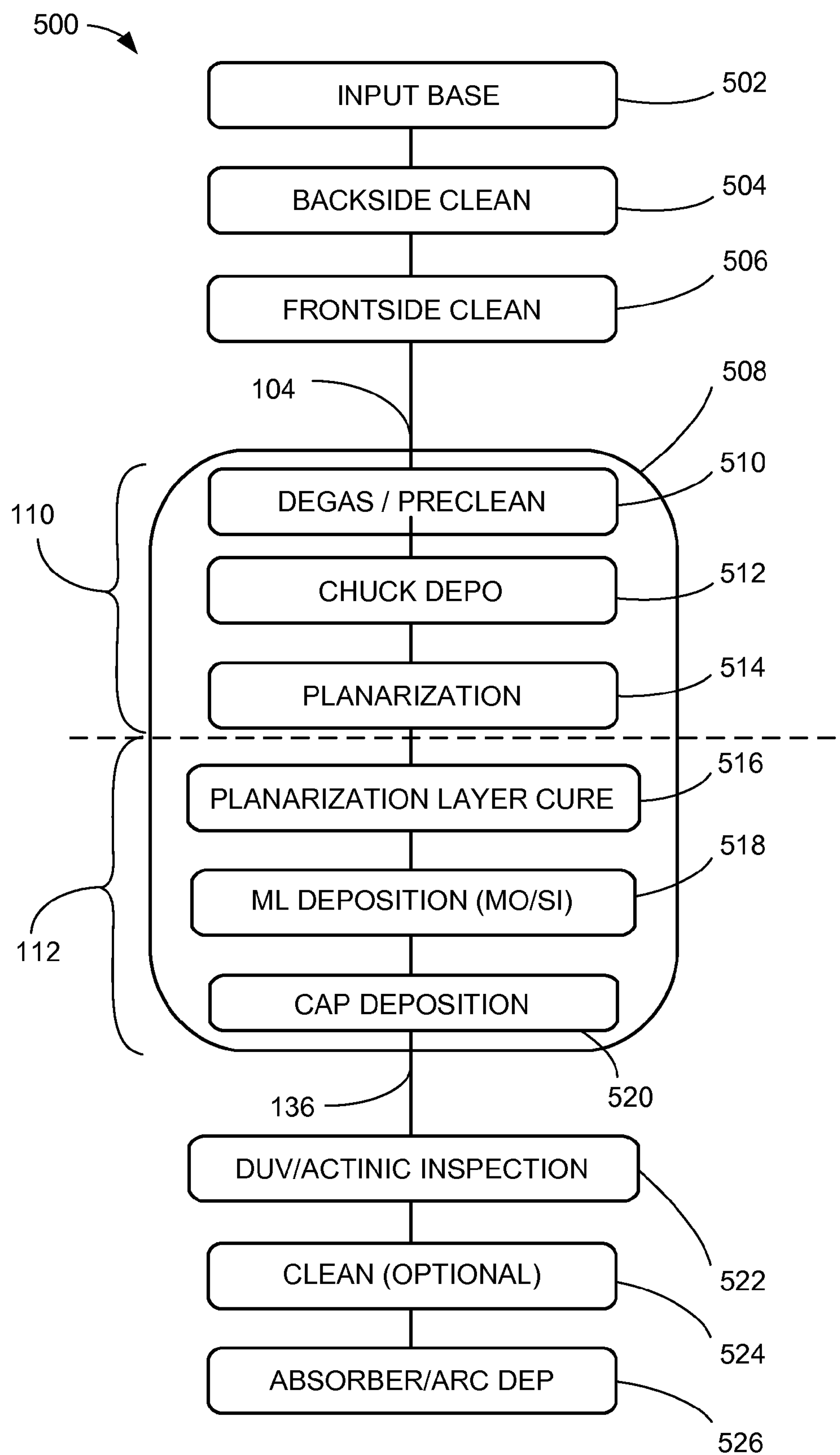
FIG. 5 is a flow chart of an alternative method for making the EUV mask blank with ultra-low defects.

Referring now to FIG. 5, therein is shown a flow chart of an alternative method 500 for making the EUV mask blank 200 with ultra-low defects. The ultra-low defects are substantially zero defects. The alternative method 500 begins with the ultra-low expansion substrate 202 of FIG. 2 being supplied in an input base step 502. The ultra-low expansion substrate 202 can be cleaned in a back-side cleaning step 504 and front-side can be cleaned in a front-side cleaning step 506.

The steps of forming a capped Bragg reflector 508 are better performed in the EUV mask blank production system 100 of FIG. 1 while under continuous vacuum to avoid contamination from ambient conditions.

The mask blank 104 is degassed and pre-cleaned in a vacuum cleaning step 510 performed in the first vacuum chamber 110. The backside chucking layer 218 is deposited in a chucking deposit step 512 and planarization occurs in a planarization step 514. The planarization layer 204 of FIG. 2 can be cured in a planarization curing step 516, which can be performed in the second vacuum chamber 112. The deposition of the multi-layer stack 206 of FIG. 2 is performed in a depositing the multi-layer stack step 518 and the capping layer 208 of FIG. 2 can be deposited in a depositing a cap deposition step 520 for forming the second in-process substrate 136.

While the DUV/Actinic inspection may be performed inside the EUV mask blank production system 100, it may occur also outside in a close inspection step 522. The second in-process substrate 136 is optionally cleaned in a second cleaning step 524, and the absorber layer 210 of FIG. 2 and anti-reflective coating 212 of FIG. 2 can be deposited in an EUV mask blank completion step 526.

Figure 6:
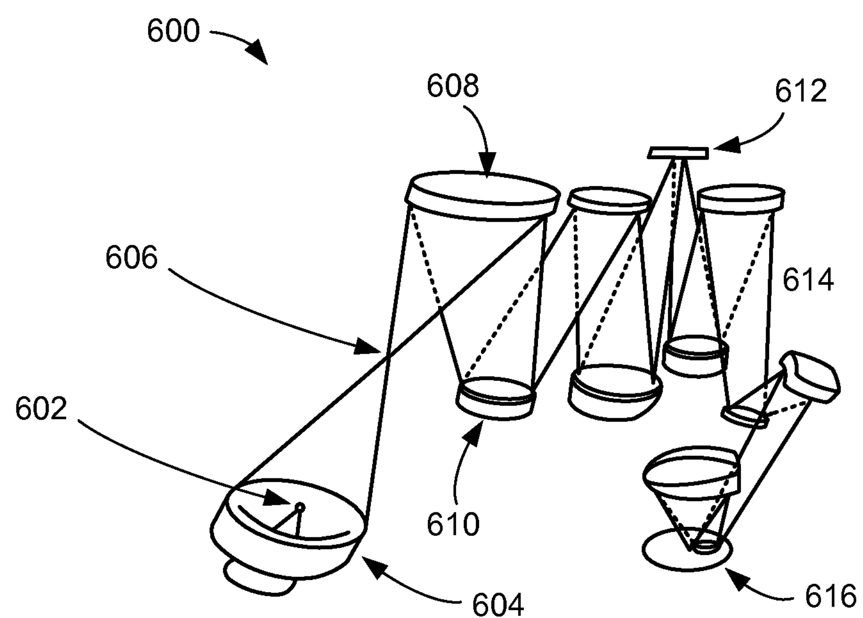
FIG. 6 is an optical train for an EUV lithography system.

Referring now to FIG. 6, therein is shown an optical train 600 for an EUV lithography system. The optical train 600 has an extreme ultraviolet light source 602, such as a plasma source, for creating the EUV light and collecting it in a collector 604. The collector 604 can have a parabolic shape for focusing the EUV light on a field facet mirror 608. The collector 604 provides the light to the field facet mirror 608 which is part of an illuminator system 606.

The surface of the field facet mirror 608 can have a concave contour in order to further focus the EUV light on a pupil facet mirror 610. The illuminator system 606 also includes a series of the pupil facet mirror 610 for transferring and focusing the EUV light on a reticle 612 (which is the fully processed version of the mask blank 104 of FIG. 1).

The reticle 612 can have a pattern that represents a processing layer of an integrated circuit. The reticle 612 reflects the EUV, light including the pattern, through projection optics 614 and onto a semiconductor substrate 616. The projection optics 614 can reduce the area of the pattern provided by the reticle 612 and repeatedly expose the pattern across the surface of the semiconductor substrate 616.

It has been discovered that embodiments planarize and smooth the EUV mask blank 200 of FIG. 2 so as to remove all pits, defects, and particles on the substrate surface so that the surface is atomically flat and smooth. The deposition of defect free material on the surface of the EUV mask blank 200 can be processed without inducing any process related defects to achieve a flat and smooth surface. The EUV mask blank 200 of FIG. 2 is a critical component of the optical train 600. The optical train 600 can sequentially position the semiconductor substrate 616 for exposure to the pattern from the reticle 612 with no manual intervention.

Figure 7:
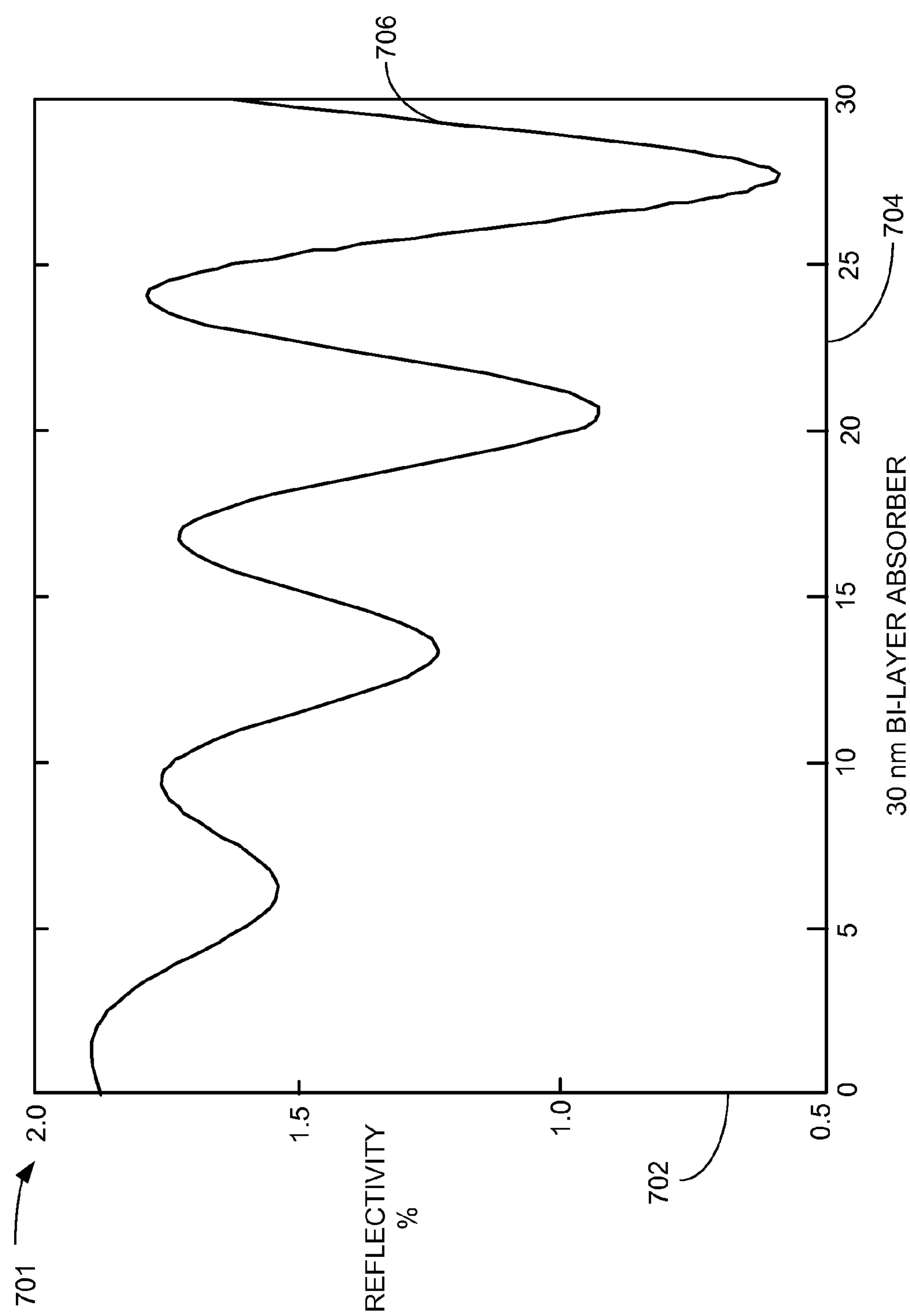
FIG. 7 shows a plot of a reflectivity percentage as a function of a thickness of the primary absorber layer of FIG. 2.

Referring now to FIG. 7, therein is shown a plot 701 of a reflectivity percentage 702 as a function of a thickness of the primary absorber layer 212 of FIG. 2. A y-axis of the plot 701 can be the reflectivity percent 702 of the bi-layer absorber 210 of FIG. 2. An x-axis can be the dimension of a thickness 704 of the primary absorber layer 212 in a 30 nm embodiment of the bi-layer absorber 210.

A sample reflectivity 706 can show the resultant trace of the reflectivity percent 702 based on increasing the thickness 704 of the primary absorber layer 212. The sample reflectivity 706 can show the thickness 704 of the primary absorber layer 212 being silver (Ag) in a nickel-silver embodiment of the bi-layer absorber 210. The order in which the two layers are deposited is very important for reflectivity loss due to path difference induced phase shift.

An embodiment provides the bi-layer absorber 210 having the primary absorber layer 212 as a silver (Ag) layer, deposited on the capping layer 208 of FIG. 2, and the secondary absorber layer 214 of FIG. 2 as a nickel (Ni) layer for providing a 30 nm combined thickness 211 of FIG. 2. The oscillations shown in the sample reflectivity 706 are due to the phase matching of the bi-layer absorber 210 with the capping layer 208 and the multi-layer stack 206 of FIG. 2. The total thickness 211 of the bi-layer absorber 210 is 30 nm. As can be seen from the graph, the lowest level of the reflectivity percent 702 is provided by 27.7 nm of silver and 2.3 nm of nickel to form the bi-layer absorber 210.

The embodiment assumes that the capping layer 208 is a thin Ruthenium layer of 2 nm in thickness. The behavior of the bi-layer absorber 210 is plotted on the capped multilayer. An aspect of the bi-layer absorber 210 is creating a path difference induced phase shift which will result in a destructive interference leading to reduction of the reflectivity percentage 702. This behavior depends on the real part of the refractive index of the metal layers. FIG. 7 shows an embodiment of the bi-layer absorber 210 as a nickel-silver bi-layered absorber. The reflectivity percentage 702 as a function of increasing the thickness 704 of silver is shown as the sample reflectivity 706. The total thickness 211 of the absorber stack is kept constant at 30 nm. So as the silver thickness increases, the nickel thickness simultaneously decreases. It is shown that at 2.3 nm Ni and 27.7 nm Ag thicknesses, the overall reflectivity is 0.58%, which is much lower than the reflectivity for a pure 30 nm Ni (1.9%) or pure 30 nm Ag (1.6%) layers. The oscillation in the sample reflectivity 706 is due to the phase matching and mismatching due to path difference induced phase shift.

As shown in Table 1, the bi-layer absorber 210 formed of nickel (Ni) on silver (Ag) provides substantially less reflectivity percentage 702 than other combinations.

TABLE 1

The lowest reflectivity for a 30 nm bi-layer absorber is modeled for a few metal systems.

| Bilayer Absorber (M2)-(M1) | 2nd absorber (M2) nm | 1st absorber (M1) nm | Reflectivity % |
|---|---|---|---|
| Ni—Sn | 2.5 | 27.5 | 1.775% |
| Ni—Pt | 2 | 28 | 1.80% |
| Zn—Pt | 2 | 28 | 1.28% |
| Ni—Ag | 2.3 | 27.7 | 0.58% |
| Sb—In | 2.5 | 27.5 | 1.75% |
| Te—In | 2 | 28 | 1.29% |
| Ni—In | 2.3 | 27.7 | 1.71% |
| Zn—Ni | 3.5 | 26.5 | 1.30% |

Table 1 is a compilation of the lowest value of the reflectivity percentage 702 for a 30 nm bi-layer absorber 210. The order in which these bi layers are deposited is very important for controlling the phase mismatching in the system. These embodiments of the bi-layer absorber 210 can be deposited by PVD, CVD, ALD, RF, and DC magnetron sputtering techniques. Most of these metals form a very thin layer of native oxide, which affects the absorption and phase shift behavior very little at 13.5 nm.

TABLE 2

The smallest thickness required to get 0.8% reflectivity for a bi-layer absorber.

| 2nd Absorber (M2) nm | 1st Absorber (M1) nm | Total Absorber thickness (nm) |
|---|---|---|
| 3.9 Cu | 28.6 Ni | 32.5 |
| 3.2 Ni | 23.3 Ag | 26.5 |
| 3.6 Cu | 28.9 Sn | 32.5 |
| 3.3 Sn | 23.5 Ag | 26.8 |
| 3.1 Cu | 22.5 Ag | 25.6 |
| 4.7 Cr | 22.5 Ag | 27.2 |
| 4.3 Ta | 22.4 Ag | 26.7 |
| 6.1 $Bi_2Te_3$ | 26.3 $Sb_2Te_3$ | 32.4 |

The smallest of the thickness 704 required for the bi-layer absorber 210 to get 0.8% reflectivity percentage 702 is tabulated in Table 2. The selection criteria for these materials are based on the ability to be etched selectivity and the smallest thickness required to achieve 0.8% reflectivity percentage 702. The atomic scattering factors of these materials can have higher real and imaginary characteristics than other elements in the periodic table. The higher imaginary characteristic accounts for the absorption and the real part corresponds to the ability to modulate the phase of the incident light. The phase modulation also depends on the thickness 704 of the absorber, since it's related to the path difference induced phase shift.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An extreme ultraviolet (EUV) mask blank comprising:

an ultra-low expansion substrate including surface imperfections;

a planarization layer on the ultra-low expansion substrate encapsulating the surface imperfections;

a multi-layer stack over the planarization layer; and a bi-layer absorber over the multi-layer stack including a primary absorber layer and a secondary absorber layer having a combined thickness of 30 nm, the primary absorber layer having a thickness that provides a reflectivity of less than 1.9% at a wavelength of 13.5 nm.

2. The mask blank as claimed in claim 1 further comprising a capping layer formed on the multi-layer stack and the bi-layer absorber formed on the capping layer, the capping layer protecting the multi-layer stack.

3. The mask blank as claimed in claim 1 wherein the thickness of the primary absorber layer includes the range of 26.5 nm to 28 nm.

4. The mask blank as claimed in claim 1 wherein the thickness of the secondary absorber layer includes the range of 2 nm to 3.5 nm.

5. The mask blank as claimed in claim 1 further comprising an additional multi-layer stack formed directly on the planarization layer, wherein the additional multi-layer stack includes up to 60 of the multi-layer stack formed in a vertical stack.

6. The system mask blank as claimed in claim 1 wherein the bi-layer absorber includes the primary absorber layer of Tin (Sn), Platinum (Pt), Silver (Ag), Indium (In), or Nickel (Ni).

7. The mask blank as claimed in claim 1 wherein the bi-layer absorber includes the secondary absorber layer of Nickel (Ni), Zinc (Zn), Antimony (Sb), Chromium (Cr), Copper (Cu), Tantalum (Ta), or Tellurium (Te).

8. The mask blank as claimed in claim 1 wherein the bi-layer absorber includes the primary absorber layer of Silver (Si) and the secondary absorber layer of Nickel (Ni) deposited to the combined thickness of 30 nm.

9. The mask blank as claimed in claim 1 wherein the bi-layer absorber includes the primary absorber layer of Platinum (Pt) and the secondary absorber layer of Zinc (Zn) deposited to the combined thickness of 30 nm.

10. The mask blank as claimed in claim 1 wherein the bi-layer absorber includes the primary absorber layer of Indium (In) and the secondary absorber layer of Tellurium (Te) deposited to the combined thickness of 30 nm.

* * * * *

UNITED STATES PATENT AND TRADEMARK OFFICE

CERTIFICATE OF CORRECTION

PATENT NO. : 9,581,889 B2
APPLICATION NO. : 14/620123
DATED : February 28, 2017
INVENTOR(S) : Vinayak Vishwanath Hassan It is certified that error appears in the above-identified patent and that said Letters Patent is hereby corrected as shown below:

In the Claims

In Claim 6, Column 10, Line 7, "system mask blank" should be replaced with --mask blank--.

In Claim 8, Column 10, Line 17, the formula "(Si)" should be replaced with --(Ag)--.

Signed and Sealed this
Twelfth Day of December, 2017

Joseph Matal

Joseph Matal
*Performing the Functions and Duties of the*
*Under Secretary of Commerce for Intellectual Property and*
*Director of the United States Patent and Trademark Office*